United States Patent
Jeong et al.

(10) Patent No.: US 7,462,536 B2
(45) Date of Patent: Dec. 9, 2008

(54) METHOD OF FORMING BIT LINE OF SEMICONDUCTOR MEMORY DEVICE

(75) Inventors: Cheol Mo Jeong, Icheon-si (KR); Whee Won Cho, Cheongju-si (KR); Jung Geun Kim, Seoul (KR); Seung Hee Hong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/680,500

(22) Filed: Feb. 28, 2007

(65) Prior Publication Data

US 2008/0057688 A1    Mar. 6, 2008

(30) Foreign Application Priority Data

Sep. 6, 2006    (KR) .................... 10-2006-0085747

(51) Int. Cl.
*H01L 21/336*    (2006.01)
(52) U.S. Cl. .................. 438/258; 438/638; 438/673; 438/620; 438/E21.018

(58) Field of Classification Search .......... 438/618–624, 438/637–638, 672–673, 257–258, 593
See application file for complete search history.

(56) References Cited

U.S. PATENT DOCUMENTS 5,502,008 A * 3/1996 Hayakawa et al. .......... 438/675
6,875,684 B2 * 4/2005 Jin et al. ..................... 438/618

* cited by examiner

*Primary Examiner*—Dung A. Le
(74) *Attorney, Agent, or Firm*—Townsend and Townsend and Crew LLP

(57) ABSTRACT

A method of forming a bit line of a semiconductor memory device is performed as follows. A first interlayer insulating layer is formed over a semiconductor substrate in which an underlying structure is formed. A region of the first interlayer insulating layer is etched to form contact holes through which a contact region of the semiconductor substrate is exposed. A low-resistance tungsten layer is deposited on the entire surface including the contact holes, thus forming contacts. A CMP process is performed in order to mitigate surface roughness of the low-resistance tungsten layer. The low-resistance tungsten layer on the interlayer insulating layer is patterned in a bit line metal line pattern, forming a bit line.

13 Claims, 2 Drawing Sheets

METHOD OF FORMING BIT LINE OF SEMICONDUCTOR MEMORY DEVICE

CROSS-REFERENCES TO RELATED APPLICATIONS

The present application claims priority to Korean patent application number 10-2006-085747, filed on Sep. 06, 2006, which is incorporated by reference in its entirety.

BACKGROUND OF THE INVENTION

The present invention relates to semiconductor memory devices, and more particularly to a method of forming a bit line of a semiconductor memory device, which can reduce the resistance of the bit line.

Recently, the research into sub-80 nm devices has been conducted. In sub-80 nm technology, forming patterns using a photolithography poses a difficult challenge. In other words, the exposure technique employing a krypton fluoride (KrF, 248 nm) light source and a Reactive Ion Etch (RIE) technique for 100 nm devices appears to have reached its limit.

In the case of 100 nm devices (e.g., DRAM), a photolithography process is used to form the critical layers using a KrF light source. For the metal layers, most of the patterns are formed using RIE. These process techniques have been used in mass production so far without significant problems. However, in the case of sub-80 nm devices, a pattern formation process performed using the existing KrF & RIE methods may not be possible.

In particular, in the case of a bit line having the smallest pitch in the design rule for 100 nm devices, the pitch becomes lower than the Final Inspection Critical Dimension (FICD) in sub-80 nm devices. In this situation, KrF has reached its limit. Thus, an argon fluoride (ArF, 193 nm) light source, which has a smaller wavelength, is being considered for the next generation device.

Due to the importance of the photo resist, a significant amount of research has been conducted on the use of ArF. This is because the ArF light source has high resolutions due to its small wavelength, but must use a thin resist to keep the Depth Of Focus (DOF) margin small. However, the ArF resist has a low etch selectivity for the resist when the RIE etch process is performed. Thus, it is expected that there will be difficulties in performing the etch process. That is, if a thin resist with low selectivity is used, etch process margins can be reduced significantly. However, the etch process for future nanoscale devices may have limitations.

To increase the etch process margins between the ArF light source and the resist, research has been conducted into a damascene process of patterning the oxide layer, depositing metal, and then performing a Chemical-Mechanical Polishing (CMP). This is because, in general, it is advantageous to etch the oxide layer rather than the metal or a nitride layer since the selectivity is high in the same resist thickness. That is, the damascene process may become a fundamental method used for increasing the process margin of the etch process. Furthermore, the damascene process can be applied to fabrication of micro devices because the process margin with respect to the photo resist becomes high in the photo process.

Furthermore, as devices are miniaturized, polysilicon and tungsten silicide are being replaced with a material having less resistivity, e.g., tungsten, in order to enhance the speed of the device. This move to metal with lower resistivity is generally applied first to the bit line since it tends to have the smallest pitch in the device.

BRIEF SUMMARY OF THE INVENTION

Embodiments of the present invention are directed to a method of forming a bit line of a semiconductor memory device, in which a contact and a bit line are formed using a low-resistance tungsten by means of a RIE method, thus reducing the sheet resistance value of the bit line, simplifying process steps, and improving TAT.

According to an embodiment of the present invention, a method of forming a bit line of a semiconductor memory device includes the steps of; forming a first insulating layer over a semiconductor substrate in which an underlying structure is formed; etching a region of the first insulating layer, thus forming contact holes through which a contact region of the semiconductor substrate is exposed; forming a barrier metal layer on the sidewalls and bottom surface of the contact holes; depositing a low-resistance tungsten layer on the entire surface including the contact holes, thus forming contacts; performing a CMP process to reduce surface roughness of the low-resistance tungsten layer; and patterning the low-resistance tungsten layer on the first insulating layer in a bit line metal line pattern, forming a bit line.

The method further includes the step of forming a barrier metal layer on sidewalls and a bottom surface of the contact holes anterior to the step of forming the contact holes and depositing the low-resistance tungsten layer.

The low-resistance tungsten layer may be formed to a thickness of 1500 to 2000 angstrom using tungsten having a resistance value of 9 to 12 $\Omega \cdot \mu m$.

In the step of depositing the low-resistance tungsten layer, $B_2H_6$ or $SiH_4$ may be doped in order to create a nucleus.

DESCRIPTION OF SPECIFIC EMBODIMENTS

Figure 1:
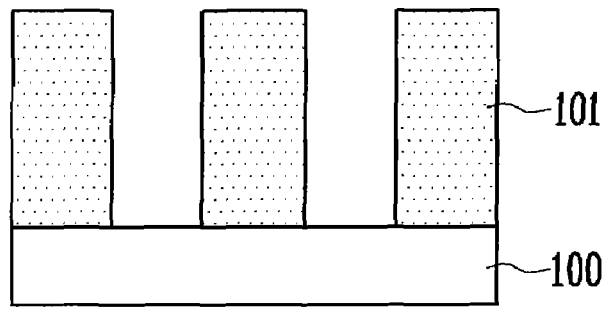
FIGS. 1 to 6 are cross-sectional views illustrating a method of forming a bit line of a semiconductor memory device according to an embodiment of the present invention.

Referring to FIG. 1, a first insulating layer 101 is formed over a semiconductor substrate 100 in which an underlying structure is formed. The first insulating layer 101 is etched using a photo resist pattern so that a region is exposed where the underlying structure and a contact will be connected to each other, thus forming contact holes. The photo resist pattern is removed.

Figure 2:
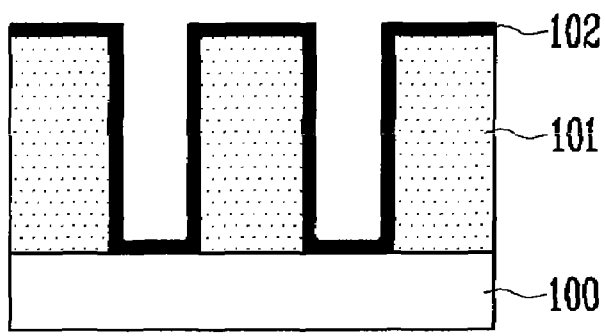

Referring to FIG. 2, a pre-treatment cleaning process is performed to remove any remaining residue on the underlying structure. A barrier metal layer 102 is formed on the entire surface including the contact holes. The barrier metal layer 102 functions to prevent the contact material from diffusing into the surrounding material in a subsequent contact process.

Figure 3:
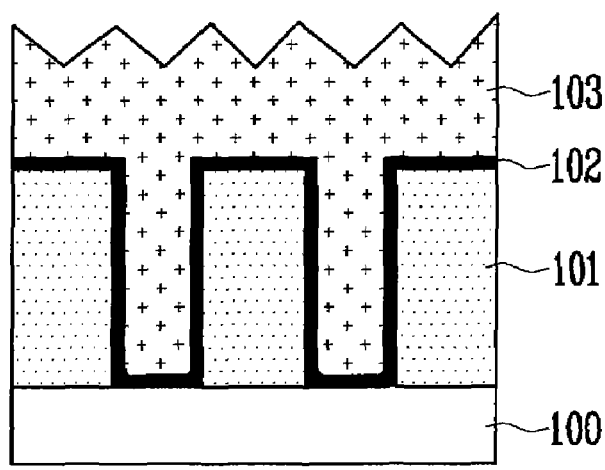

Referring to FIG. 3, a low-resistance tungsten layer 103 is formed on the barrier metal layer 102. At this time, the contact holes are gap-filled with the low-resistance tungsten layer 103, thus forming contacts. The low-resistance tungsten layer 103 is formed to a thickness of 1500 to 2000 angstrom, which includes some material to be removed during a subsequent chemical mechanical polishing (CMP) process. The low-resistance tungsten layer 103 may have a resistance value of 9 to 12 $\Omega \cdot \mu m$. The low-resistance tungsten layer 103 is formed by doped with $B_2H_6$ or/and $SiH_4$ in a nucleation step of tungsten deposition steps. This controls the nucleus creation of tungsten to increase the grain size of bulk tungsten. If the low-resistance tungsten layer 103 is used in the bit line, the sheet resistance Rs is decreased.

Figure 4:
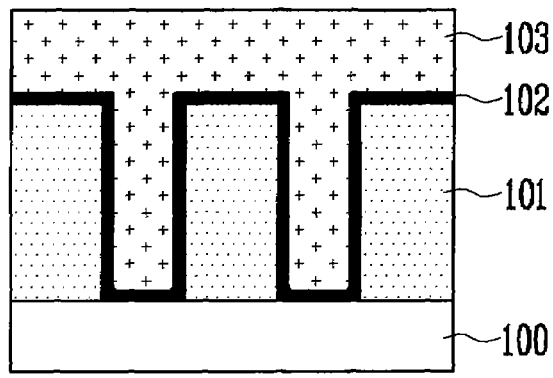

Referring to FIG. 4, a CMP process is performed to polish the surface of the low-resistance tungsten layer 103 to reduce the roughness. The CMP process is controlled so that only the surface of the low-resistance tungsten layer 103 is removed without exposing the barrier metal layer 102.

Figure 5:
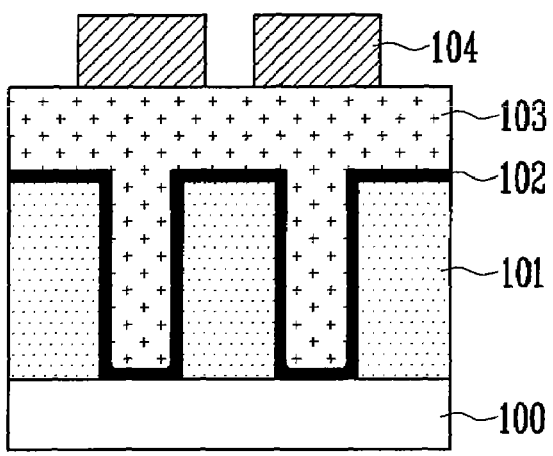

Referring to FIG. 5, a hard mask pattern 104 including a SiON layer, an α-carbon layer and an anti-reflection layer is formed on the low-resistance tungsten layer 103.

Figure 6:
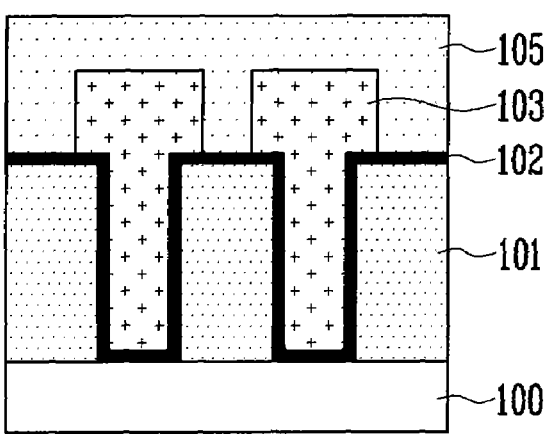

Referring to FIG. 6, the low-resistance tungsten layer 103 is etched employing the hard mask pattern. In regions other then the bit line region the barrier metal layer 102 is also etched along with the low-resistance tungsten layer 103. A second insulating layer 105 is formed on the entire surface. The second insulating layer 105 is formed by means of a HDP process or a SOG process.

As described above, according to the present invention, in the process of forming the bit line of the semiconductor memory device, the contact and the bit line are formed using low-resistance tungsten by means of a RIE method. Accordingly, sheet resistance of a bit line can be reduced, process steps can be simplified, and TAT can be improved.

The detailed embodiments of the present invention are for illustrative purposes and not limited. Various alternatives or modifications are possible in view of the present disclosure and are intended to fall within the spirit and scope of the appended claims.

What is claimed is:

1. A method of forming a bit line of a semiconductor memory device, the method comprising:
    forming a first insulating layer over a semiconductor substrate;
    etching a region of the first insulating layer to form contact holes that expose portions of the semiconductor substrate;
    forming a low-resistance tungsten layer over the first insulating layer to fill the contact holes;
    reducing a surface roughness of the low-resistance tungsten layer without exposing the first insulating layer underlying the low-resistance tungsten layer; and
    forming a bit line by patterning the low-resistance tungsten layer whose surface roughness has been reduced over the first insulating layer.

2. The method of claim 1, wherein the low-resistance tungsten layer is formed to a thickness of 1500 to 2000 angstrom.

3. The method of claim 1, wherein the low-resistance tungsten layer has a resistance value of 9 to 12 $\Omega\cdot\mu m$.

4. The method of claim 1, wherein the low-resistance tungsten layer is formed by doped with $B_2H_6$ or $SiH_4$ or both in a nucleation step of tungsten deposition steps to increase the grain size of a bulk tungsten.

5. The method of claim 1, wherein patterning the low-resistance tungsten layer comprises:
    forming a hard mask pattern including a SiON layer, an α-carbon layer and an anti-reflection layer over the low-resistance tungsten layer; and
    etching the low-resistance tungsten layer employing the hard mask pattern.

6. The method of claim 1, further comprising forming a second insulating layer by means of a HDP process or a SOG process after forming the bit line.

7. The method of claim 1, comprising forming a barrier layer over the contact holes before forming the low-resistance tungsten layer.

8. the method of claim 1, wherein the surface roughness of the low-resistance tungsten layer is reduced by performing a chemical mechanical polishing (CMP) process.

9. A method of forming a bit line of a semiconductor memory device, the method comprising:
    forming a first insulating layer over a substrate;
    etching a region of the first insulating layer to form a contact hole that exposes a portion of the substrate;
    forming a low-resistance tungsten layer over the first insulating layer to fill the contact hole;
    reducing a surface roughness of the low-resistance tungsten layer without exposing the first insulating layer underlying the low-resistance tungsten layer; and
    patterning the low-resistance tungsten layer whose surface roughness has been reduced over the first insulating layer, the patterned low-resistance tungsten layer being a bit line having an upper portion that extends above the contact hole and a lower portion that fills the contact hole.

10. The method of claim 9, wherein the low-resistance tungsten layer is formed to a thickness of 1500 to 2000 angstrom.

11. The method of claim 9, wherein the low-resistance tungsten layer has a resistance value of 9 to 12 $\Omega\cdot\mu m$.

12. The method of claim 9, wherein the low-resistance tungsten layer is formed by doped with $B_2H_6$ or $SiH_4$ or both in a nucleation step of tungsten deposition steps to increase the grain size of a bulk tungsten.

13. The method of claim 9, wherein patterning the low-resistance tungsten layer comprises:
    forming a hard mask pattern including a SiON layer, an α-carbon layer and an anti-reflection layer over the low-resistance tungsten layer; and
    etching the low-resistance tungsten layer employing the hard mask pattern.

* * * * *